(12) United States Patent
Lee et al.

(10) Patent No.: US 10,274,519 B2
(45) Date of Patent: Apr. 30, 2019

(54) WAFER INSPECTION EQUIPMENT HAVING LASER CLEANING FUNCTION

(71) Applicant: IMT CO., LTD., Suwon-si (KR)

(72) Inventors: Jong Myoung Lee, Anyang-si (KR); Kyu Pil Lee, Hwaseong-si (KR); Seong Ho Jo, Yongin-si (KR)

(*) Notice: Subject to any disclaimer, the term of this patent is extended or adjusted under 35 U.S.C. 154(b) by 63 days.

(21) Appl. No.: 15/519,060

(22) PCT Filed: Nov. 9, 2015

(86) PCT No.: PCT/KR2015/011968
§ 371 (c)(1),
(2) Date: Apr. 13, 2017

(87) PCT Pub. No.: WO2016/104942
PCT Pub. Date: Jun. 30, 2016

(65) Prior Publication Data
US 2017/0285071 A1 Oct. 5, 2017

(30) Foreign Application Priority Data

Dec. 23, 2014 (KR) .................. 10-2014-0187450
Sep. 18, 2015 (KR) .................. 10-2015-0132125
Oct. 12, 2015 (KR) .................. 10-2015-0141924

(51) Int. Cl.
*H01L 21/00* (2006.01)
*G01R 3/00* (2006.01)
(Continued)

(52) U.S. Cl.
CPC .......... *G01R 3/00* (2013.01); *G01R 1/07314* (2013.01); *G01R 1/00* (2013.01); *H01L 21/687* (2013.01); *H01L 2221/00* (2013.01); *H05K 1/00* (2013.01)

(58) Field of Classification Search
CPC ....... H01L 21/00; H01L 2221/00; G01R 1/00; H05K 1/00
See application file for complete search history.

(56) References Cited

U.S. PATENT DOCUMENTS

2006/0228825 A1* 10/2006 Hembree ............ B23K 20/004
438/51
2008/0094594 A1* 4/2008 Shibazaki ............. G01D 5/266
355/53
(Continued)

FOREIGN PATENT DOCUMENTS

KR 10-2002-0001701 1/2002
KR 10-2006-0126267 12/2006
(Continued)

OTHER PUBLICATIONS

English translation of 10-2007-0024796.
(Continued)

*Primary Examiner* — Jermele M Hollington
*Assistant Examiner* — Temilade S Rhodes-Vivour
(74) *Attorney, Agent, or Firm* — Antonio Ha & U.S. Patent, LLC (57) ABSTRACT

A wafer test machine is disclosed. The wafer test machine comprises a main body having a chamber defined therein, wherein a probe card is disposed at an upper portion of the chamber; a chuck for fixing a wafer in the chamber; a moving unit for moving the chuck in the chamber, thus making a contact between the probe card and the wafer; and a laser cleaning apparatus for cleaning the probe card in the chamber using a laser beam, when the probe card does not contact the wafer.

18 Claims, 7 Drawing Sheets

(51) Int. Cl.
  *G01R 1/073* (2006.01)
  *H05K 1/00* (2006.01)
  *G01R 1/00* (2006.01)
  *H01L 21/687* (2006.01)

(56) References Cited

U.S. PATENT DOCUMENTS

| | | | |
|---|---|---|---|
| 2008/0105665 A1* | 5/2008 | Kondo | B23K 26/067 |
| | | | 219/121.77 |
| 2010/0038560 A1* | 2/2010 | Tokura | B08B 7/0042 |
| | | | 250/492.1 |
| 2011/0235675 A1* | 9/2011 | Matsudo | H01L 21/67109 |
| | | | 374/130 |
| 2013/0200914 A1* | 8/2013 | Kim | G01R 1/07342 |
| | | | 324/756.03 |

FOREIGN PATENT DOCUMENTS

| | | |
|---|---|---|
| KR | 10-2007-0024796 | 3/2007 |
| KR | 10-0706814 | 4/2007 |
| KR | 10-2010-0024062 | 3/2010 |

OTHER PUBLICATIONS

English translation of 10-2006-0126267.
English translation of 10-2002-0001701.
English translation of 10-0706814.
English translation of 10-2010-0024062.

* cited by examiner

WAFER INSPECTION EQUIPMENT HAVING LASER CLEANING FUNCTION

TECHNICAL FIELD

The present invention relates to a wafer test machine comprising a function for cleaning the probe card by a laser beam in a wafer test chamber.

BACKGROUND ART

In general, a wafer test machine tests a wafer by contacting the wafer with a probe card. Probes of the probe card contact the electric pads formed on the wafer precisely. Due to frequent contacts between the probes and the electric pads, contaminants are accumulated on the probes. The increase of contaminants deteriorates reliability of the wafer test. Conventional probe cleaning technology needs to separate the probe card from the wafer test machine. The conventional probe cleaning technology may cause the wear of the probe, because the probe is mechanically cleaned with a cleaning pad.

DISCLOSURE

Technical Problem

One object of the invention is to provide a wafer test machine comprising a function for cleaning the probe card by a laser beam in a wafer test chamber.

Technical Solution

According to the present invention, a wafer test machine comprises a main body having a chamber defined therein, wherein a probe card is disposed at an upper portion of the chamber; a chuck for fixing a wafer in the chamber; a moving unit for moving the chuck in the chamber, thus making a contact between the probe card and the wafer; and a laser cleaning apparatus for cleaning the probe card by a laser beam in the chamber, when the probe card does not contact the wafer.

In an embodiment, the laser cleaning apparatus is installed in the chamber for generating the laser beam in the chamber and irradiating the laser beam on the probe card, and the laser cleaning apparatus is moved by the moving unit.

In an embodiment, the moving unit comprises an X-Y moving stage for moving the chuck along an X-axis and along a Y-axis, and a chuck lifter mounted on the X-Y moving stage and constructed to raise or lower the chuck, the laser cleaning apparatus is mounted on the X-Y moving stage and separated from the chuck lifter, and the laser cleaning apparatus is movable to a position opposite to the probe card by the X-Y moving stage.

In an embodiment, the laser cleaning apparatus is lowered or raised along a Z-axis by a lifter for laser cleaning, and wherein the lifter for the laser cleaning is operated independently from the chuck lifter.

In an embodiment, the wafer test machine further comprises a contaminant removing unit for suctioning and removing particulate contaminants separated from the probe card during laser cleaning, In an embodiment, the laser beam used for cleaning the probe card is the thing that is introduced into the chamber from the outside.

In an embodiment, the laser cleaning apparatus comprises a laser module having a laser generator and disposed outside the chamber and an inner laser cleaning unit disposed in the chamber to clean the probe card by using the laser beam introduced into the chamber through a laser introducing window.

In an embodiment, the inner laser cleaning unit comprises a laser transferring part using at least one mirror part and a laser irradiation part for receiving the laser beam from the laser transferring part and irradiating the laser beam to the probe card by using an end mirror.

In an embodiment, the laser beam travelling distance in the chamber changes due to the change of the position of the laser irradiation part, and wherein the laser module comprises a compensation unit for compensating the change of the laser beam travelling distance.

In an embodiment, the compensation unit comprises a pair of fixed mirrors, a pair of moving mirrors respectively corresponding to the fixed mirrors, and a mirror moving robot which moves the pair of moving mirrors forwardly and backwardly against to the pair of fixed mirrors, wherein the pair of fixed mirrors comprise a first fixed mirror and a second fixed mirror, wherein the pair of moving mirrors comprise a first moving mirror and second moving mirror, wherein the first fixed mirror reflects the laser beam transferred from the laser generator or another mirror toward to the first moving mirror at an angle of 90°, the first moving mirror reflects the laser beam transferred from the first fixed mirror toward to the second moving mirror at an angle of 90°, the second moving mirror reflects the laser beam transferred from the first moving mirror toward to the second fixed mirror at an angle of 90° and the second fixed mirror reflects the laser beam transferred from the second moving mirror toward the inside of the chamber at an angle of 90°.

In an embodiment, the moving unit comprises a Y-axis guide formed on a bottom of the chamber, a Y-axis moving block movable along the Y-axis guide an X-axis guide formed on the Y-axis moving block, an X-axis moving block movable along the X-axis guide, and a chuck lifter mounted on the X-axis moving block for raising and lowering the chuck along the Z-axis, wherein the laser transferring part comprises a first mirror part fixed in the chamber, a second mirror part mounted on the Y-axis moving block and movable along only the Y-axis, a third mirror part mounted on the X-axis moving block and movable both along the Y-axis and the X-axis, and wherein the first mirror part reflects the laser beam introduced into the chamber through the laser introducing window toward the second mirror part, the second mirror part reflects the laser beam transferred from the first mirror part toward the third mirror part, and the third mirror part reflects the laser beam transferred from the second mirror part toward to the laser irradiation part.

In an embodiment, the wafer test machine further comprises a contaminant suction module for suctioning and removing particulate contaminants separated from the probe card during laser cleaning, wherein the contaminant suction module comprises a funnel-shaped opening with wide top and narrow bottom and at least one contaminant suction and discharge hole extending from an inside of the funnel-shaped opening to an outside of the funnel-shaped opening laterally, wherein a lower end of the funnel-shaped opening covers a laser emitting window, wherein, the laser emitting window is formed on a top of the laser irradiation part.

In an embodiment, the wafer test machine further comprises a brush cleaning apparatus for brushing and cleaning the probe card and collecting a contaminant separated from the probe card due to the brushing.

In an embodiment, the moving unit comprises X-Y moving stage for moving the chuck along the X-axis and along the Y-axis, and a chuck lifter mounted on the X-Y moving stage and constructed to raise or lower the chuck, wherein the brush cleaning apparatus is positioned at the X-Y moving stage and separated from the chuck lifter, and wherein the brush cleaning apparatus is movable to a position opposite to the probe card by the X-Y moving stage, wherein the brush cleaning apparatus is lowered or raised along the Z-axis by a lifter for brush cleaning, and wherein the lifter for brush cleaning is operated independently from the chuck lifter.

In an embodiment, the brush cleaning apparatus comprises a funnel-shaped opening with wide top and narrow bottom arid a brush fixed to an inner surface of the funnel-shaped opening for separating contaminants from the probe card by brushing operation, and at least one contaminant suction and discharge hole formed on the inner surface of the funnel-shaped opening.

In an embodiment the brush comprises a metal brush.

In an embodiment, the wafer test machine further comprises a reference plate for measuring the level of the brush, wherein the level of the brush is measured by using the short phenomenon between the brush and the reference plate.

In an embodiment, the laser cleaning apparatus comprises a laser irradiation part disposed under the funnel-shaped opening for irradiating the laser beam to the probe card through the funnel-shaped opening.

Advantageous Effects

According to the present invention, it is able to clean the probe card without the probe card from the wafer test chamber, so it is economical. According to the present invention, many problems resulted from wear of the probe can be easily solved, because the probe card is cleaned with a laser beam.

DESCRIPTION OF DRAWINGS

The objects, features and advantages of the present invention will be more apparent from the following detailed description in conjunction with the accompanying drawings, in which.

BEST MODE

[First Embodiment]

Figure 1:
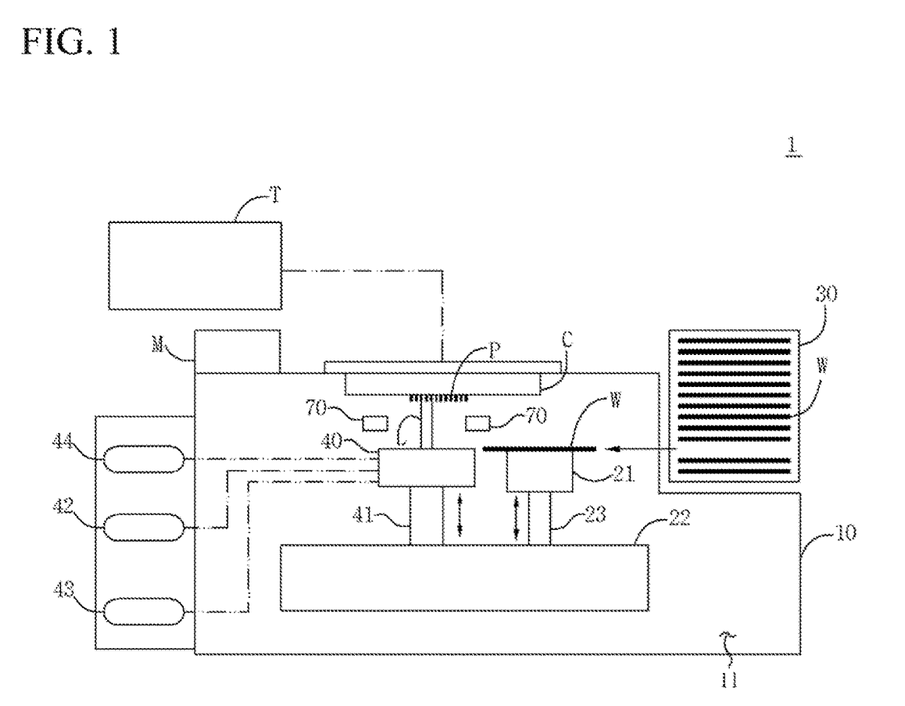
FIG. 1 is an illustration showing the wafer test machine according to a first embodiment.

Referring to FIG. 1, a wafer test machine 1 according to the first embodiment of the invention includes a main body 10 having a chamber 11 for wafer test defined therein. A probe card C is disposed at an upper portion of the chamber 11 and faces downwardly in the chamber 11. The probe card C has a plurality of probes P extending downwardly. Also, the wafer test machine 1 includes a chuck 21 and a moving unit for moving the chuck 21 along an X-axis, a Y-axis and a Z-axis. The moving unit comprises an X-Y moving stage 22 constructed to move the chuck 21 along the X-axis and the Y-axis, and a chuck lifter mounted on the X-Y moving stage 22 and constructed to raise or lower the chuck 21 along the Z-axis, A wafer cassette 30 may be disposed at a side of the main body 10. Also, the wafer test machine 1 may include loading means to pick up the wafer from the wafer cassette and load the wafer on the chuck 21 disposed in the chamber 11. Loading means may be selected among the known loading means.

When a wafer W fixed on the chuck contacts the probe P, Tester T supplies variable electric signals to elements on the wafer and obtains the electrical characteristics for comprehending the good or bad of the elements.

Also, the wafer test machine 1 includes a laser cleaning apparatus 40 disposed in the chamber 11. When the probe card C does not, contact the wafer W, the laser cleaning apparatus 40 cleans the probe P with a laser beam. The laser cleaning apparatus 40 is mounted on the X-Y moving stage 22 and separated from the chuck 21. Accordingly, X-Y moving stage 40 can move the chuck 21 along the X-axis and/or the Y-axis for testing the wafer W and as well can move the laser cleaning apparatus 40 along the X-axis and/or the Y-axis for cleaning the probe card C.

The laser cleaning apparatus 40 is connected to the X-Y moving stage 22 by a lifter for laser cleaning 41, and can be raised or lowered by the lifter for laser cleaning 41. After the laser cleaning apparatus 40 is moved to a position under the probe card C, that is to say, opposite to the probe P by an X-Y moving stage 22, the distance between the probe C and the cleaning apparatus 40 can be adjusted by upward and downward operation of the lifter for laser cleaning 41.

Preferably, the laser cleaning apparatus 40 directly irradiates the laser beam with a collimated beam shape to the probe card C without using any lens for beam focusing. This eliminates the trouble in controlling the level of the laser cleaning apparatus 40 according to change of the probe card C.

It is preferable that the laser beam should be a pulsed laser beam that is easy for controlling the process of cleaning. Also, it is preferable that the laser beam has a wave length of 200~1500 nm, a peak power/pulse of $10^6$ W or more, and an energy density/pulse of 0.1 j/cm$^2$ or more.

Also, the wafer test machine 1 may include a cooling apparatus 43, a control apparatus 44 and a power supply apparatus 42 for laser cleaning. For saving space in the main body 10 in which a wafer test and a probe cleaning should be performed, the cooling apparatus 43, the control apparatus 44 and the power supply apparatus 42 are preferably positioned outside the main body 10. A cooling line, a control line and a cooling line respectively extending from the cooling apparatus 43, the control apparatus 44 and the power supply apparatus 42, are introduced in to the chamber 11 and are connected to the laser cleaning apparatus 40.

It is preferable that the control apparatus 44 should be a general computer or a touch panel based controller. It is preferable that the cooling apparatus 43 should be a cooler using water(more specifically cooling water) as a cooling means. The cooling apparatus 43, the control apparatus 44 and the power supply apparatus 42 can be integrated in a package attached to a side of the main body 10, if that, the total size of the wafer test machine 1 would be minimized. The control apparatus 44 and a main control apparatus M originally existed for control necessary for wafer test control are connected and controlled synchronously. Accordingly, the control apparatus 44 can clean contaminated area existed in various forms on the probe card C in cooperation with the moving unit including the X-Y moving stage 22 and chuck lifter 23.

Figure 2:
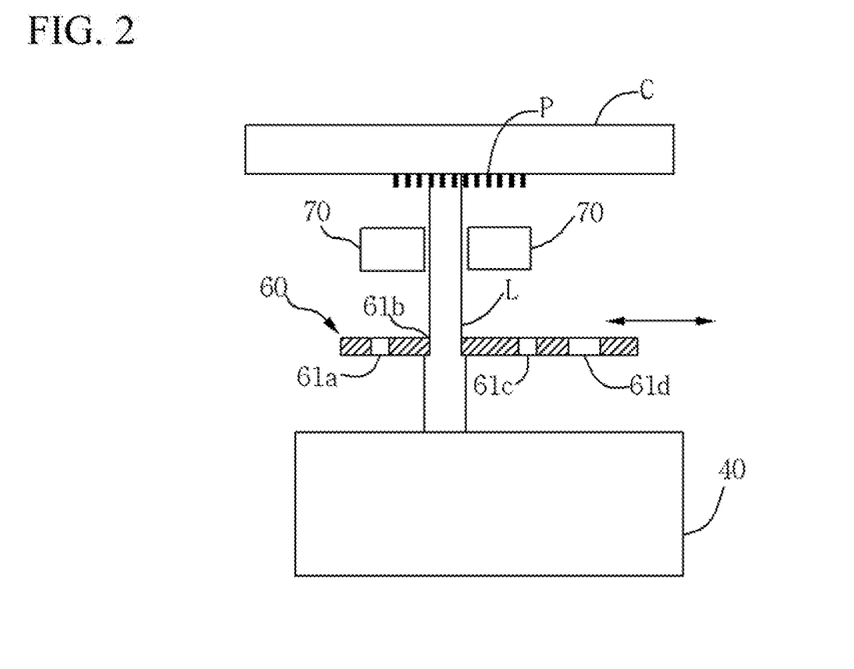
FIG. 2 and FIG. 3 are illustrations showing the laser cleaning apparatus as shown in FIG. 1.
Figure 3:
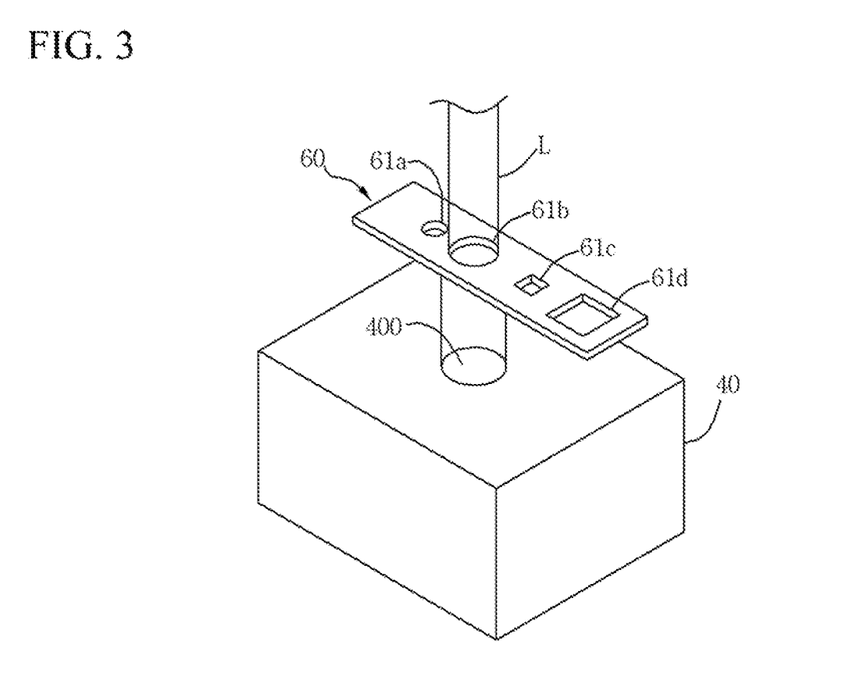
Figure 4:
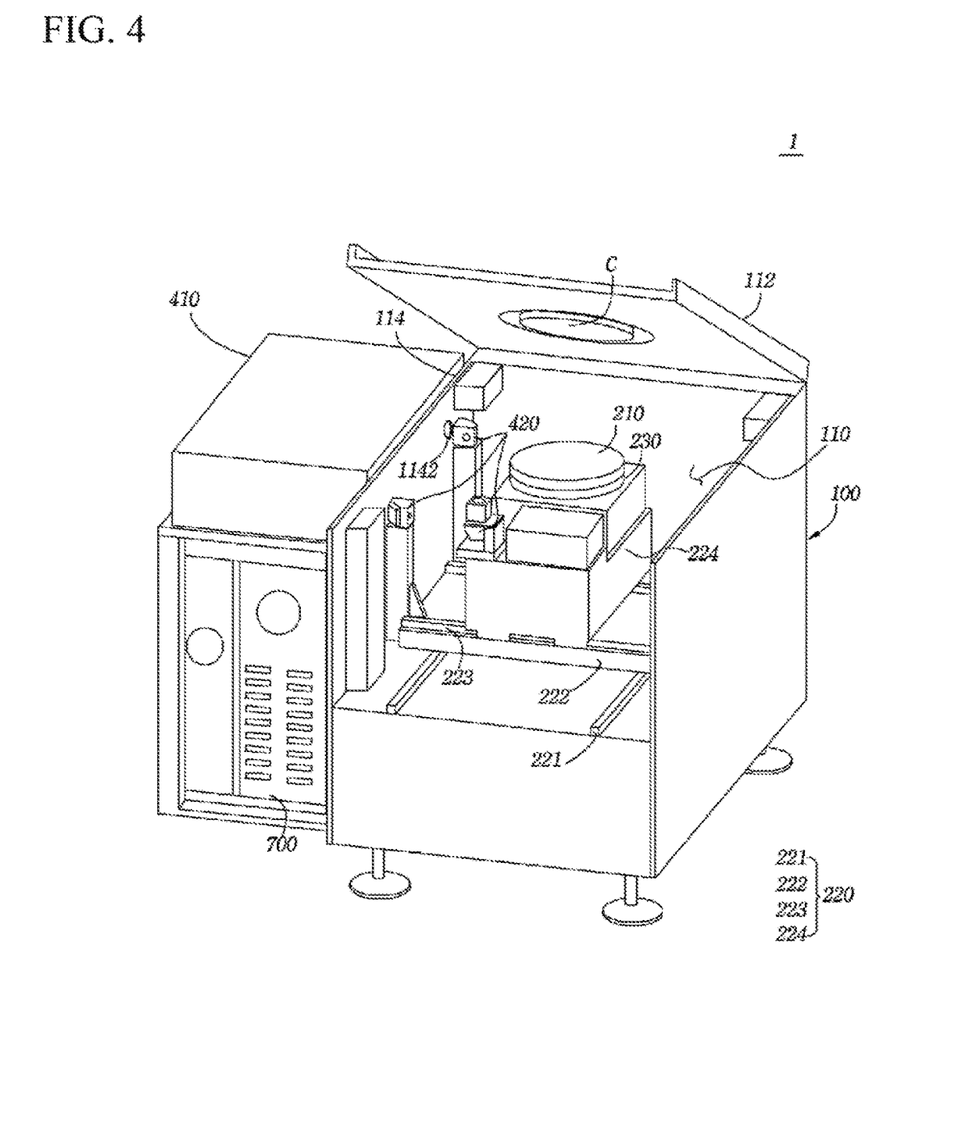
FIG. 4 to FIG. 8 are illustrations showing the laser cleaning apparatus to second embodiment.
Figure 5:
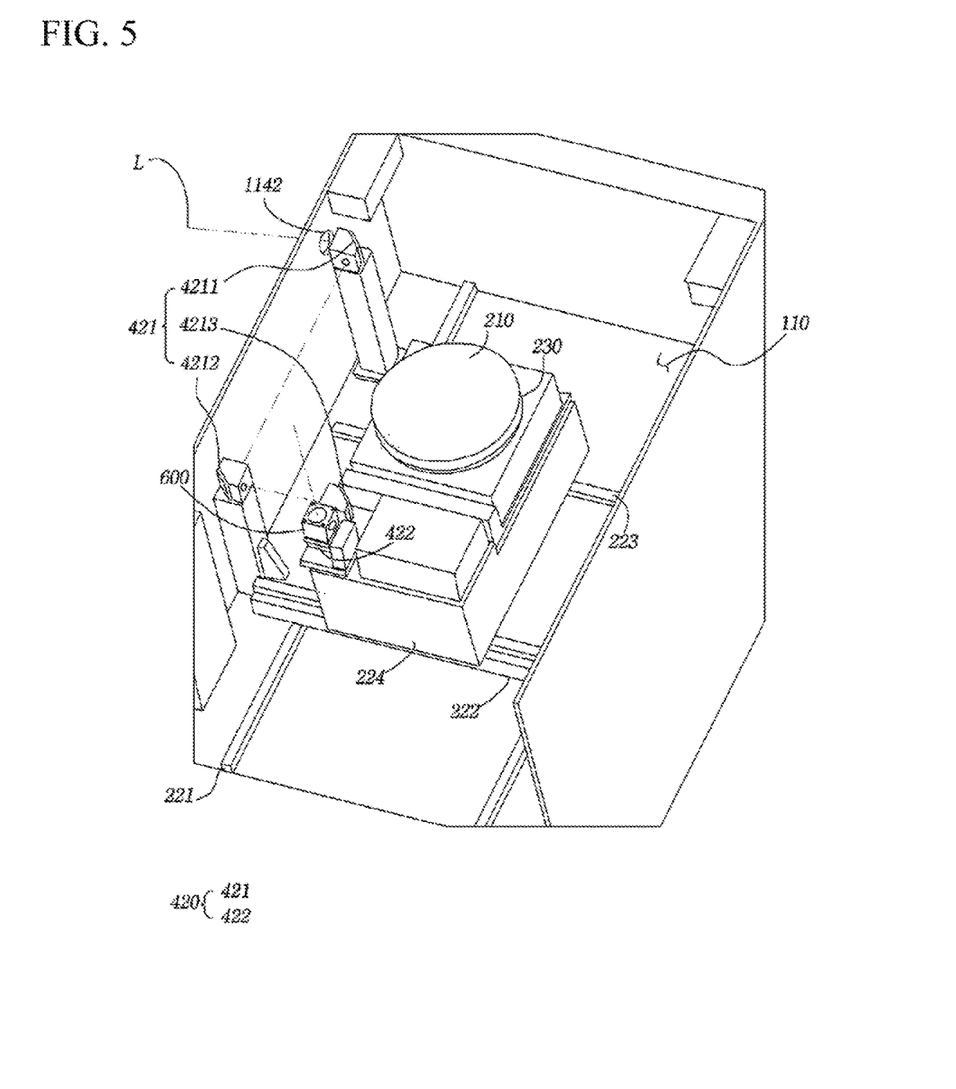
Figure 6:
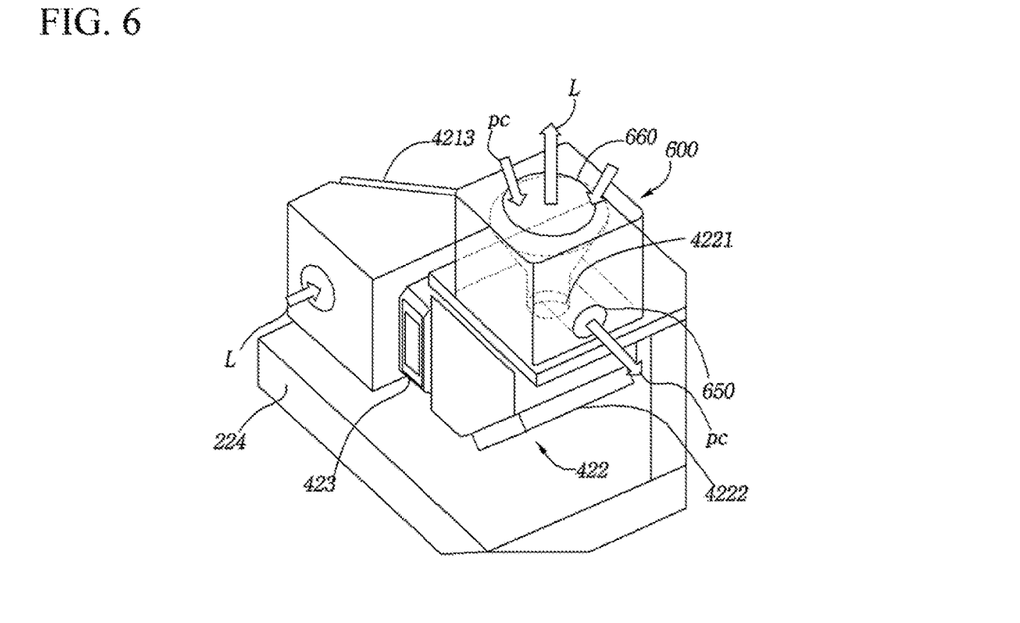
Figure 7:
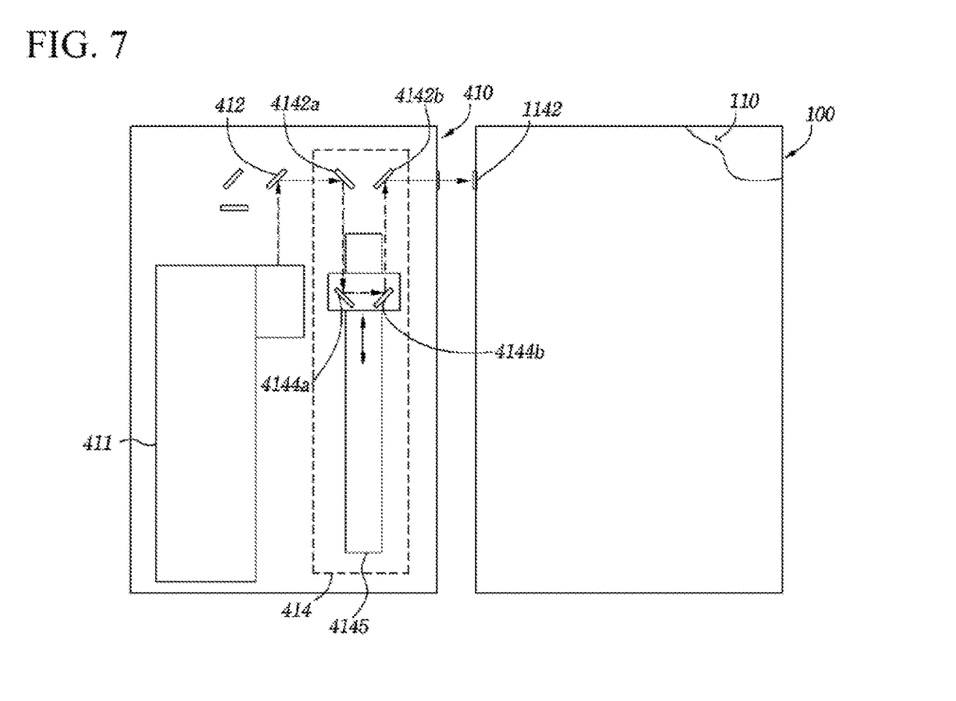
Figure 8:
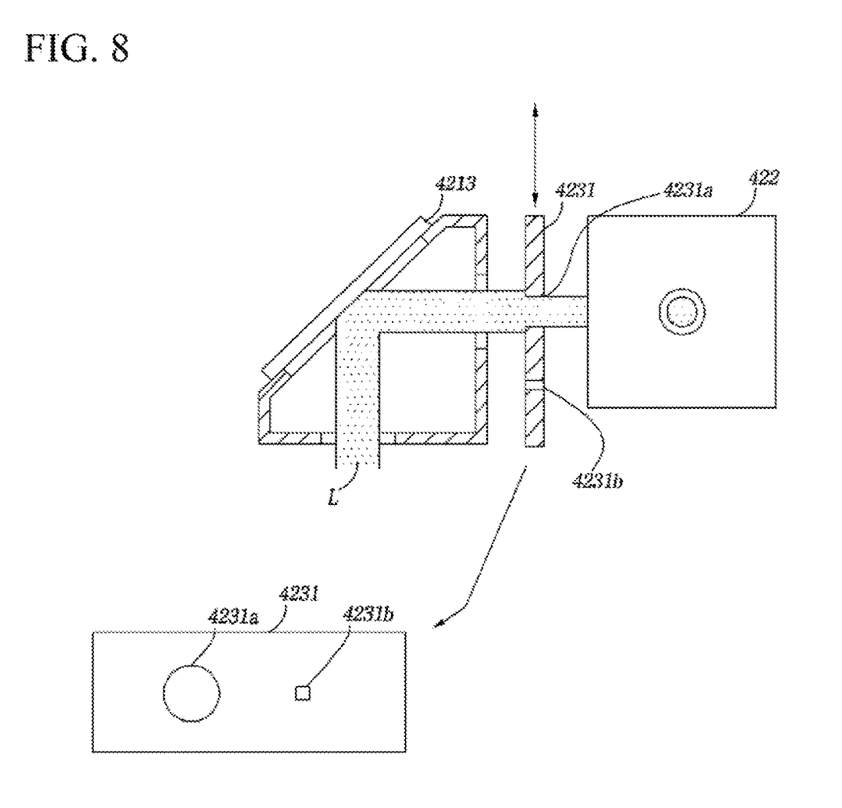

Referring to FIG. 2 and FIG. 3, the laser beam L is emitted through an upper area of the laser cleaning apparatus 40. The upper area is closed by a laser window 400 having a beam penetration ratio of 99% or more. The laser window lets more than 99% of the emitted laser output and completely closes the upper area to seal the inner space of the laser cleaning apparatus 40 for preventing particulate contaminants from getting into the laser cleaning apparatus 40.

Also, the wafer test machine includes laser beam adjusting, unit 60. The laser beam adjusting unit 60 includes a plurality of beam apertures 61a, 61b, 61c and 61d, of which sizes and/or shapes are different. The laser beam adjusting unit 60 can adjust the laser beam L with various sizes or various shapes by selecting and using one among the plurality of apertures 61a, 61b, 61c and 61. The laser beam adjusting unit 6 is particularly appropriate to clean only a specific small area.

To match the laser beam with a desired beam aperture 61a, 61b, 61c or 61 and thus make the laser beam with a desired size or shape, the laser beam adjusting unit 60 should be moved.

During the laser cleaning, particulate contaminants are separated from the probe card C. It is important to remove the particulate contaminants. For removing the particulate contaminants, the wafer test machine 1 further comprises a contaminant removing unit 70 for suctioning and removing the particulate contaminants separated from the probe card C during the laser cleaning. The contaminant removing unit 70 is positioned near the cleaning area of the probe card C, and can remove about 100% of the particulate contaminants generated during the laser cleaning. It is preferable that a distance between the contaminant removing unit 70 and the cleaning area is less than 10 cm for effective cleaning.

[Second Embodiment]

Referring to FIG. 4 to FIG. 8, a wafer test machine 1 according to the first embodiment of the invention includes a main body 110 having a chamber 110 for wafer test defined therein. A probe card C is disposed at an upper portion of the chamber 110 and faces downwardly in the chamber 110. An upper wall 112 of the chamber 110 is constructed such that the upper wall 112 can rotate around a hinge. When the wafer test using the probe card C or the probe card cleaning is performed. the upper wall 112 maintains horizontal position unlike FIG. 4

Also, the wafer test machine 1 includes a chuck 210 and moving unit for moving the chuck 210 along an X-axis, a Y-axis and a Z-axis. The moving unit comprises a Y-axis guide 221 formed on a bottom of the chamber 110, a Y-axis moving block 222 movable along the Y-axis guide 221, an X-axis guide 223 formed on the Y-axis moving block 222, an X-axis moving block 224 movable along the X-axis guide 223, and a chuck lifter 230 mounted on the X-axis moving block 224 for raising and lowering the chuck 210 along the Z-axis. The Y-axis guide 221, the Y-axis moving block 222, the X-axis guide 223 and the X-axis moving block 224 constitute X-Y moving stage 220 which moves the chuck 210 along the X-axis and the Y-axis by driving of an X-axis driving part and Y-axis driving part.

When the wafer fixed on the chuck is tested, the wafer W contacts the probe of the probe card C in the chamber 110 of the main body 110.

Also, the wafer test machine 1 includes a laser cleaning apparatus for immediately cleaning the probe of the probe card C with a laser beam in the chamber 110 and removing contaminants on the probe. The laser cleaning apparatus comprises a laser module 410 disposed outside the chamber 110, which generates a laser beam and lets the laser beam into the chamber 110 through the laser introducing window formed with transparent material at a side wall 114 of the chamber 110, and an inner laser cleaning unit 420 for cleaning the probe of the probe card C with laser beam introduced into the chamber 110.

The inner laser cleaning unit 420 comprises a laser transferring part 421 which receives the laser beam from outside of the chamber 110 and transfers the laser beam horizontally in the chamber 110 at a constant height in the chamber 110 and a laser irradiation part 422 which is mounted on the X-Y moving stage, more specifically on the X-axis moving block 224 and vertically irradiates the laser beam transferred from the laser transferring part 421 to the probe of the probe card C.

The laser transferring part 421 comprises a first mirror part 4211 fixed in the chamber 110, a second mirror part 4212 mounted on the Y-axis moving block 222 and movable along the only the Y-axis, a third mirror part 4213 mounted on the X-axis moving block 224 and movable both along the Y-axis and the X-axis. The first mirror part 4211 reflects the laser beam introduced into the chamber 110 through the laser introducing window 1142 toward the second mirror part 4212 at an angle of 90°. The second mirror part 4212 reflects the laser beam transferred from the first mirror part 4211 toward the third mirror part 4213 at an angle of 90°. The third mirror part 4213 reflects the laser beam transferred from the second mirror part 4213 toward to the laser irradiation part 422 at an angle of 90°.

The laser irradiation part 422 receives the laser beam from the third mirror part 4213 and vertically irradiates the laser beam to the probe card by reflecting the laser beam at a right angle using an end mirror 4222. At this time, the laser beam is emitted through a laser emitting window formed at the upper portion of the housing of the laser irradiation part 422. The laser irradiation part 422 has the same or similar structure to the first, second or third mirror part 4211, 4212 or 4213.

The second mirror part 4212 together with the third mirror part 4213 can be moved along the Y-axis by the moving of the Y-axis moving block 222 along the Y-axis. By the moving of the second mirror part 4212 along the Y-axis, the laser beam travelling distance between the second mirror part 4212 and the first mirror part 4211 along the Y-axis increases or decreases.

The third mirror part 4213 together with the laser irradiation part 422 can be moved along the X-axis by the moving of the X-axis moving block 224 along the X-axis. By the moving of the third mirror part 4213 along the X-axis, the laser beam travelling distance between the second mirror part 4212 and the third mirror part 4213 along the X-axis increases or decreases.

It is able to adjust the X-Y coordinates of the laser irradiation part 422 as intended by moving the Y-axis moving block 222 along the Y-axis to move the second mirror part 4212 and the third mirror part 4213 along the X-axis or moving X-axis moving block 224 along the X-axis to move the second mirror part 4213 and the laser irradiation part 422 along the X-axis in the condition that the position of the first mirror 4211 is fixed.

Due to the moving of the second mirror part 4212 and the third mirror part 4213, the distance that the laser beam introduced into the chamber travels to laser irradiation part 422, varies. The variation of the distance may cause the variation of energy density of thee laser beam finally irradiated from the laser irradiation part 422 to the probe card C because of the divergence of the laser beam.

In this embodiment, the laser module 410 includes a compensation unit for compensating the change of the laser beam travelling distance therein. The compensation unit keeps a constant total laser beam travelling distance and keeps a constant energy density of the laser beam by varying the laser beam travelling distance outside the chamber 110, even though the laser beam travelling distance would be vary in the chamber 110.

In this embodiment, the wafer test machine may include a laser beam adjusting unit 60 for keeping a size or a shape of the laser beam as intended, regardless of the vibration or the shock resulted from the moving of the second mirror 4212 and third mirror 4213. The laser beam adjusting unit 423 may be disposed at an in et of the laser irradiation part 422.

Meanwhile, the wafer test machine further comprises a contaminant suction module 600 for suctioning and removing particulate contaminants pc separated from the probe of the probe card C during the laser cleaning. The contaminant suction module 600 comprises funnel-shaped opening 660 with wide top and narrow bottom and at least one contaminant suction and discharge hole 650 extending from an inside of the funnel-shaped opening 660 to an outside of the funnel-shaped opening 660 laterally. The contaminant suction module 600 is mounted on the top of the laser irradiation part 422, so that a lower end of the funnel-shaped opening covers a laser emitting window 4221. The laser beam L emitted though the laser emitting window 4221 from the laser irradiation part 422 passes through the funnel-shaped opening 660 larger than the laser window 4221 to irradiate the probe card C.

The particulate contaminants pc separated from the probe of the probe card C is suctioned into the funnel-shaped opening 660 by the suction force generating means connected to the contaminant suction and discharge hole 650, and then are discharged through the contaminant suction and discharge hole 650 to the outside before reaching the laser emitting window 4221.

Also, the wafer test machine comprises a laser cleaning controller 700 having a chiller outside the main body 100.

The laser cleaning controller 700 and a main control apparatus M originally existed for control necessary for wafer test control are connected and controlled synchronously. Accordingly, the control laser cleaning controller 700 can clean contaminated area existed in various forms on the probe card C in cooperation with the moving unit including the X-Y moving stage 220 and chuck lifter 230.

Meanwhile, the laser module 410 comprises a laser generator 411 and a compensation unit 414. Also, the laser module 410 may include at least one mirror 412 for transferring the laser beam generated by the laser generator 411 to the compensation unit 414. The compensation unit is constructed to adjust the laser beam travelling distance outside the chamber 110 for compensating the change of the laser beam travelling distance so as to keep a constant total laser beam travelling distance.

In this embodiment, the compensation unit 414 comprises a pair of fixed mirrors 4142a and 4142b, a pair of moving mirrors 4144a, 4144b respectively corresponding to the fixed mirrors 4142a and 4142b, and a mirror moving robot 4145 which moves the pair of moving mirrors 4144a and 4144b forwardly and backwardly against to the pair of fixed mirrors 4142a and 4142b.

The pair of fixed mirrors comprises a first fixed mirror 4142a and a second fixed mirror 4142b. The pair of moving mirrors comprises a first moving mirror 4144a and second moving mirror 4144b. The first fixed mirror 4142a reflects the laser beam transferred from the laser generator 411 or another mirror 412 toward to the first moving mirror 4144a at an angle of 90°. The first moving mirror 4144a reflects the laser beam transferred from the first fixed mirror 4142a toward to the second moving mirror 4144b at an angle of 90°. The second moving mirror 4144b reflects the laser beam transferred from the first moving mirror 4144a toward to the second fixed mirror 4142b at an angle of 90°. The second fixed mirror 4142b reflects the laser beam transferred from the second moving mirror 4144b toward the inside of the chamber 110 at an angle of 90° through the laser introducing window 1142 formed at the side wall 114 of the chamber 110. The mirror moving robot 4145 moves a moving mirror set including first and second moving mirrors 4144a and 4144b against the first and second fixed mirrors 4142a and 4142b forwardly or backwardly for adjusting the laser beam travelling distance outside the chamber 110 to compensate the change of the laser beam travelling distance inside the chamber 110. If the sum of laser beam travelling distance inside the chamber and the laser beam travelling distance outside the chamber adjusted by the compensation unit is constant, the energy density of the laser beam finally irradiated to the probe card C via the laser irradiation part 422 keeps constant.

Meanwhile, the laser beam adjusting unit 423 may be disposed at an inlet of the laser irradiation part 422. The laser beam adjusting unit 423 includes a mask 4231 having a plurality of beam apertures 4231a, and 4231b, of which sizes and/or shapes are different. The mask 4231 can be moved by a cylinder type actuator, so that an intended beam aperture 4231a or 4231b should be coincided with the laser beam L.

[Third Embodiment]

Figure 9:
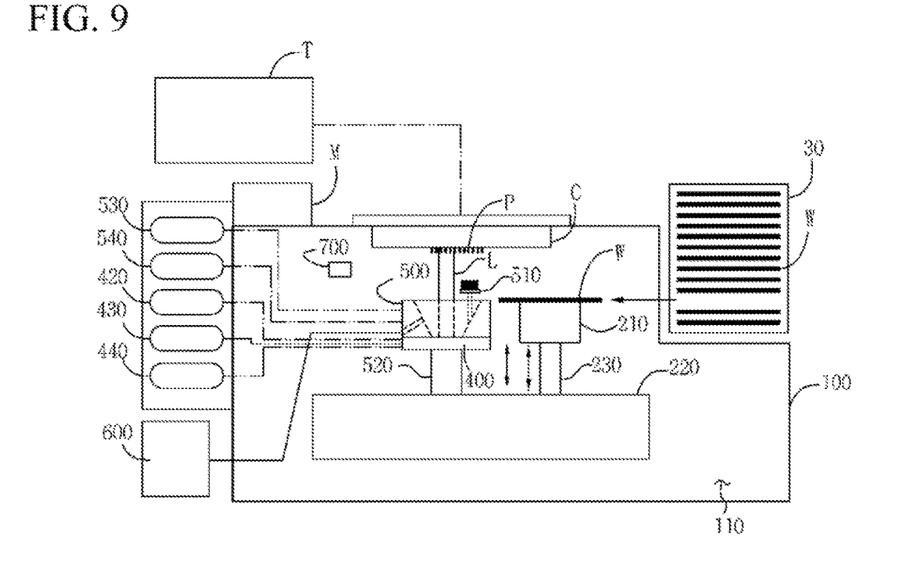
FIG. 9 and FIG. 10 are illustrations showing the laser cleaning apparatus a third embodiment.
Figure 10:
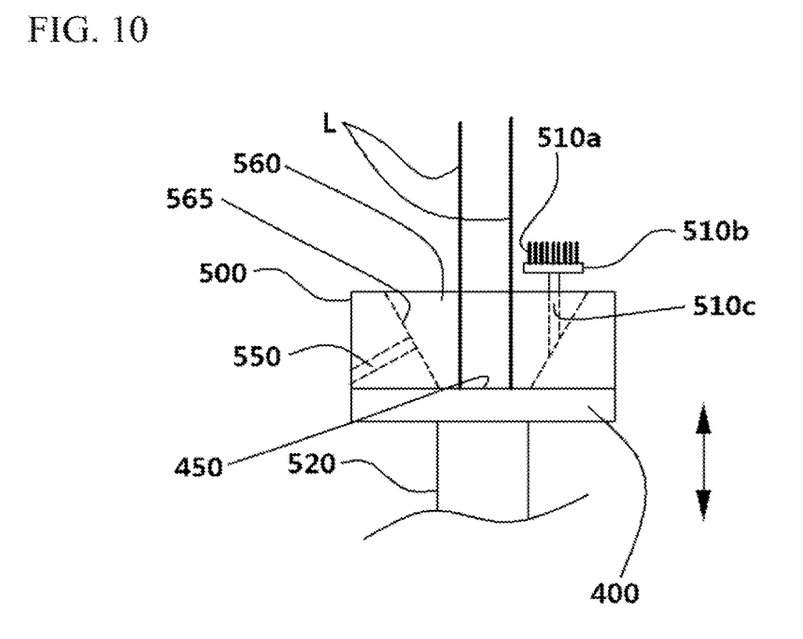

Referring to FIG. 9 and FIG. 10, a wafer test machine according to the third embodiment of the invention includes a main body 100 having a chamber 110 for wafer test defined therein. A probe card C is disposed at an upper portion of the chamber 11 and faces downwardly in the chamber 110. The probe card C has a plurality of probes P extending downwardly. Also, the wafer test machine includes a chuck 210 and a moving unit for moving the chuck 210 along an X-axis, a Y-axis and a Z-axis. The moving unit comprises an X-Y moving stage 22 constructed to move the chuck 210 along the X-axis and the Y-axis, and a chuck lifter mounted on the X-Y moving stage 220 and constructed to raise or lower the chuck 210 along the Z-axis. A wafer cassette 30 may be disposed at a side of the main body 100. Also, the wafer test machine may include loading means to pick up the wafer from the wafer cassette and load the wafer on the chuck 210 disposed in the chamber 110 Loading means may be selected among the known loading means. When a wafer W fixed on the chuck contacts the probe P, Tester T supplies variable electric signals to elements on the wafer and obtains the electrical characteristics for comprehending the good or bad of the elements.

Also, the wafer test machine includes a brush cleaning apparatus 500 for brushing and cleaning the probe P inside the chamber 110 with a brush 510 and collecting a particulate contaminant separated from the probe P. Also, the wafer test machine includes a reference plate 700 for measuring the level of the brush cleaning apparatus 500, more specifically brush 510.

The brush cleaning apparatus 500 comprises a funnel-shaped opening 560 with wide top and narrow bottom and a brush fixed to an inner surface 565 of the funnel-shaped opening 560 for separating contaminants from the probe P by brushing operation or the brush 510, and at least one contaminant suction and discharge hole 550 formed on the inner surface 565 of the funnel-shaped opening 560. It is preferable that the brush 510 comprises metal brush. Also, it is preferable that the level of the brush 510 is measured by using the short phenomenon between the brush 510 and the reference plate 710.

Also, the brush cleaning apparatus 500 is mounted at the X-Y moving stage 220 and separated from the chuck 210 and chuck lifter 230. Accordingly, the brush cleaning apparatus 500 is movable to a position opposite to the probe card C by the X-Y moving stage 220. Also, the brush cleaning apparatus 500 can be lowered or raised along the Z-axis by a lifter for brush cleaning which is operated independently from the chuck lifter 230.

Meanwhile, the wafer test machine includes a laser leaning apparatus 400 which generates the laser beam L under the funnel-shaped opening 560 and irradiates the laser beam L to the probe P through the funnel-shaped opening 560. The laser cleaning apparatus 500 is disposed under the funnel-shaped opening 560 and can irradiate the laser beam from the position under the funnel-shaped opening 560 through the funnel-shaped opening 560 to the probe P.

According to this embodiment, the brush cleaning apparatus 500 firstly separates and removes the coarse contaminants from the probe P with the brush 510, and then the laser cleaning apparatus 400 secondly separates and removes fine contaminant from the probe.

Also the wafer test machine may include a cooling apparatus 430, control apparatus 440 and a power supply apparatus 420 for laser cleaning. For saving space in the main body 100 in which wafer test and probe cleaning should be performed, the cooling apparatus 430, the control apparatus 440 and the power supply apparatus 420 are preferably positioned outside the main body 100. A cooling line, a control line and a cooling line respectively extending from the cooling apparatus 430, the control apparatus 440 and the power supply apparatus 420, are introduced into the chamber 110 and are connected to the laser cleaning apparatus 400.

It is preferable that the control apparatus 440 should be a general computer or a touch panel based controller. It is preferable that the cooling apparatus 430 should be cooler using water (more specifically cooling water) as a cooling means. The cooling apparatus 430, the control apparatus 440 and the power supply apparatus 420 can be integrated in a package attached to a side of the main body 100, if that, the total size of the wafer test machine would be minimized. Furthermore, a control apparatus 530 for brush cleaning can be integrated in the package including the cooling apparatus 430, the control apparatus 440 and the power supply apparatus 420. The control apparatus 440 for laser cleaning, the control apparatus 530 for brush cleaning and a main control apparatus M originally existed for control necessary for wafer test control are connected and controlled synchronously. Accordingly, The control apparatus 440 for laser cleaning, and the control apparatus 530 for brush cleaning can clean contaminated area existed in various forms on the probe card C in cooperation with the moving unit including the X-Y moving stage 220 and chuck lifter 230.

The wafer test machine further comprises a contaminant suction apparatus 600. The contaminant suction apparatus 600 can suction and remove the coarse contaminants, which are separated from the probe P into the funnel-shaped opening 560, by brush cleaning apparatus 500, and as well can suction and remove the fine contaminants, which are separated from the probe P and suctioned into the funnel-shaped opening 560, by laser cleaning apparatus 400.

What is claimed is:

1. A wafer test machine comprising:
    a main body having a chamber defined therein, wherein a probe card is disposed at an upper portion of the chamber;
    a chuck for fixing a wafer in the chamber;
    a moving unit for moving the chuck in the chamber, thus making a contact between the probe card and the wafer; and
    a laser cleaning apparatus for cleaning the probe card in the chamber using a laser beam, when the probe card does not contact the wafer, wherein the laser beam used for cleaning the probe card is the thing that is introduced into the chamber from outside, wherein the laser cleaning apparatus comprises a laser module having a laser generator and disposed outside the chamber and an inner laser cleaning unit disposed in the chamber to clean the probe card by using the laser beam introduced into the chamber through a laser introducing window, and wherein the inner laser cleaning unit comprises a laser transferring part using at least one mirror part and a laser irradiation part for receiving the laser beam from the laser transferring part and irradiating the laser beam to the probe card by using an end mirror.

2. The wafer test machine as claimed in claim 1, wherein the laser cleaning apparatus is installed in the chamber for generating the laser beam in the chamber and irradiating the laser beam on the probe card, and wherein the laser cleaning apparatus is moved by the moving unit.

3. The wafer test machine as claimed in claim 2, wherein the moving unit comprises an X-Y moving stage for moving the chuck along an X-axis and along an Y-axis, and a chuck lifter mounted on the X-Y moving stage and constructed to raise or lower the chuck, wherein the laser cleaning apparatus is mounted on the X-Y moving stage and separated from the chuck lifter, and wherein the laser cleaning apparatus is movable to a position opposite to the probe card by the X-Y moving stage.

4. The wafer test machine as claimed in claim 3, wherein the laser cleaning apparatus is lowered or raised along a Z-axis by a lifter for the laser cleaning, and wherein the lifter for laser cleaning is operated independently from the chuck lifter.

5. The wafer test machine as claimed in claim 1, further comprising a contaminant removing unit for suctioning and removing particulate contaminants separated from the probe card during laser cleaning.

6. The wafer test machine as claimed in claim 1, wherein the laser beam travelling distance in the chamber changes due to the change of the position of the laser irradiation part, and wherein the laser module comprises a compensation unit for compensating the change of the laser beam travelling distance.

7. The wafer test machine as claimed in claim 6, wherein the compensation unit comprises a pair of fixed mirrors, a pair of moving mirrors respectively corresponding to the fixed mirrors, and a mirror moving robot which moves the pair of moving mirrors forwardly and backwardly against to the pair of fixed mirrors, wherein the pair of fixed mirrors comprise a first fixed mirror and a second fixed mirror, wherein the pair of moving mirrors comprise a first moving mirror and second moving mirror, wherein the first fixed mirror reflects the laser beam transferred from the laser generator or another mirror toward to the first moving mirror at an angle of 90°, the first moving mirror reflects the laser beam transferred from the first fixed mirror toward to the second moving mirror at an angle of 90°, the second moving mirror reflects the laser beam transferred from the first moving mirror toward to the second fixed mirror at an angle of 90°, and the second fixed mirror reflects the laser beam transferred from the second moving mirror toward the inside of the chamber at an angle of 90°.

8. The wafer test machine as claimed in claim 7, further comprising a contaminant suction module for suctioning and removing particulate contaminants separated from the probe card during laser cleaning, wherein the contaminant suction module comprises a funnel-shaped opening with wide top and narrow bottom and at least one contaminant suction and discharge hole extending from an inside of the funnel-shaped opening to an outside of the funnel-shaped opening laterally, wherein a lower end of the funnel-shaped opening covers a laser emitting window, wherein, the laser emitting window is formed on a top of the laser irradiation part.

9. The wafer test machine as claimed in claim 6, further comprising a contaminant suction module for suctioning and removing particulate contaminants separated from the probe card during laser cleaning, wherein the contaminant suction module comprises a funnel-shaped opening with wide top and narrow bottom and at least one contaminant suction and discharge hole extending from an inside of the funnel-shaped opening to an outside of the funnel-shaped opening laterally, wherein a lower end of the funnel-shaped opening covers a laser emitting window, wherein, the laser emitting window is formed on a top of the laser irradiation part.

10. The wafer test machine as claimed in claim 1, wherein the moving unit comprises a Y-axis guide formed on a bottom of the chamber, a Y-axis moving block movable along the Y-axis guide, an X-axis guide formed on the Y-axis moving block, an X-axis moving block movable along the X-axis guide, and a chuck lifter mounted on the X-axis moving block for raising and lowering the chuck along the Z-axis, wherein the laser transferring part comprises a first mirror part fixed in the chamber, a second mirror part mounted on the Y-axis moving block and movable along only the Y-axis, a third mirror part mounted on the X-axis moving block and movable both along the Y-axis and the X-axis, and wherein the first mirror part reflects the laser beam introduced into the chamber through the laser introducing window toward the second mirror part, the second mirror part reflects the laser beam transferred from the first mirror part toward the third mirror part, and the third mirror part reflects the laser beam transferred from the second mirror part toward to the laser irradiation part.

11. The wafer test machine as claimed in claim 10, further comprising a contaminant suction module for suctioning and removing particulate contaminants separated from the probe card during laser cleaning, wherein the contaminant suction module comprises a funnel-shaped opening with wide top and narrow bottom and at least one contaminant suction and discharge hole extending from an inside of the funnel-shaped opening to an outside of the funnel-shaped opening laterally, wherein a lower end of the funnel-shaped opening covers a laser emitting window, wherein, the laser emitting window is formed on a top of the laser irradiation part.

12. The wafer test machine as claimed in claim 1, further comprising a contaminant suction module for suctioning and removing particulate contaminants separated from the probe card during laser cleaning, wherein the contaminant suction module comprises a funnel-shaped opening with wide top and narrow bottom and at least one contaminant suction and discharge hole extending from an inside of the funnel-shaped opening to an outside of the funnel-shaped opening laterally, wherein a lower end of the funnel-shaped opening covers a laser emitting window, wherein, the laser emitting window is formed on a top of the laser irradiation part.

13. The wafer test machine as claimed in claim 1, further comprising a brush cleaning apparatus for brushing and cleaning the probe card and collecting a contaminant separated from the probe card due to the brushing.

14. The wafer test machine as claimed in claim 13, wherein the moving unit comprises X-Y moving stage for moving the chuck along the X-axis and along the Y-axis, and a chuck lifter mounted on the X-Y moving stage and constructed to raise or lower the chuck, wherein the brush cleaning apparatus is positioned at the X-Y moving stage and separated from the chuck lifter, and wherein the brush cleaning apparatus is movable to a position opposite to the probe card by the X-Y moving stage, wherein the brush cleaning apparatus is lowered or raised along the Z-axis by a lifter for brush cleaning, and wherein the lifter for brush cleaning is operated independently from the chuck lifter.

15. The wafer test machine as claimed in claim 14, the brush cleaning apparatus comprises a funnel-shaped opening with wide top and narrow bottom and a brush fixed to an inner surface of the funnel-shaped opening for separating contaminants from the probe card by brushing operation, and at least one contaminant suction and discharge hole formed on the inner surface of the funnel-shaped opening.

16. The wafer test machine as claimed in claim 15, the brush comprises a metal brush.

17. The wafer test machine as claimed in claim 16, further comprising a reference plate for measuring the level of the brush, wherein the level of the brush is measured by using the short phenomenon between the brush and the reference plate.

18. The wafer test machine as claimed in claim 15, the laser cleaning apparatus comprises a laser irradiation part disposed under the funnel-shaped opening for irradiating the laser beam to the probe card through the funnel-shaped opening.

\* \* \* \* \*